United States Patent [19]

Janutka

[11] Patent Number: 4,487,458

[45] Date of Patent: Dec. 11, 1984

[54] BIDIRECTIONAL SOURCE TO SOURCE STACKED FET GATING CIRCUIT

[75] Inventor: William J. Janutka, West Allis, Wis.

[73] Assignee: Eaton Corporation, Cleveland, Ohio

[21] Appl. No.: 425,196

[22] Filed: Sep. 28, 1982

[51] Int. Cl.³ .................. H03K 17/08; H03K 17/10; H03K 17/687

[52] U.S. Cl. ................... 307/577; 307/570; 307/499; 307/583; 307/585

[58] Field of Search ............ 307/241, 242, 570, 571, 307/572, 577, 582, 583, 584, 270, 304, 499, 501, 352, 353, 200 B; 357/23 GP

[56] References Cited

FOREIGN PATENT DOCUMENTS

| 55178 | 2/1979 | Japan | 357/23 GP |
| 136721 | 10/1980 | Japan | 307/571 |
| 143836 | 11/1980 | Japan | 307/584 |

OTHER PUBLICATIONS

Evans, *Designing with Field-Effect Transistors*, pp. 197-215, and pp. 273-274, McGraw-Hill Book Co., 1981.

Primary Examiner—Larry N. Anagnos
Assistant Examiner—David R. Bertelson
Attorney, Agent, or Firm—Andrus, Sceales, Starke & Sawall

[57] ABSTRACT

Stacked gating circuitry is provided for controlling a plurality of pairs of power FETs stacked in series, each pair being bidirectionally source to source connected for AC conduction. All the power FETs turn on from a single gate terminal through series connected current sources, one current source for each FET pair. The FETs turn on in ripple effect.

14 Claims, 1 Drawing Figure

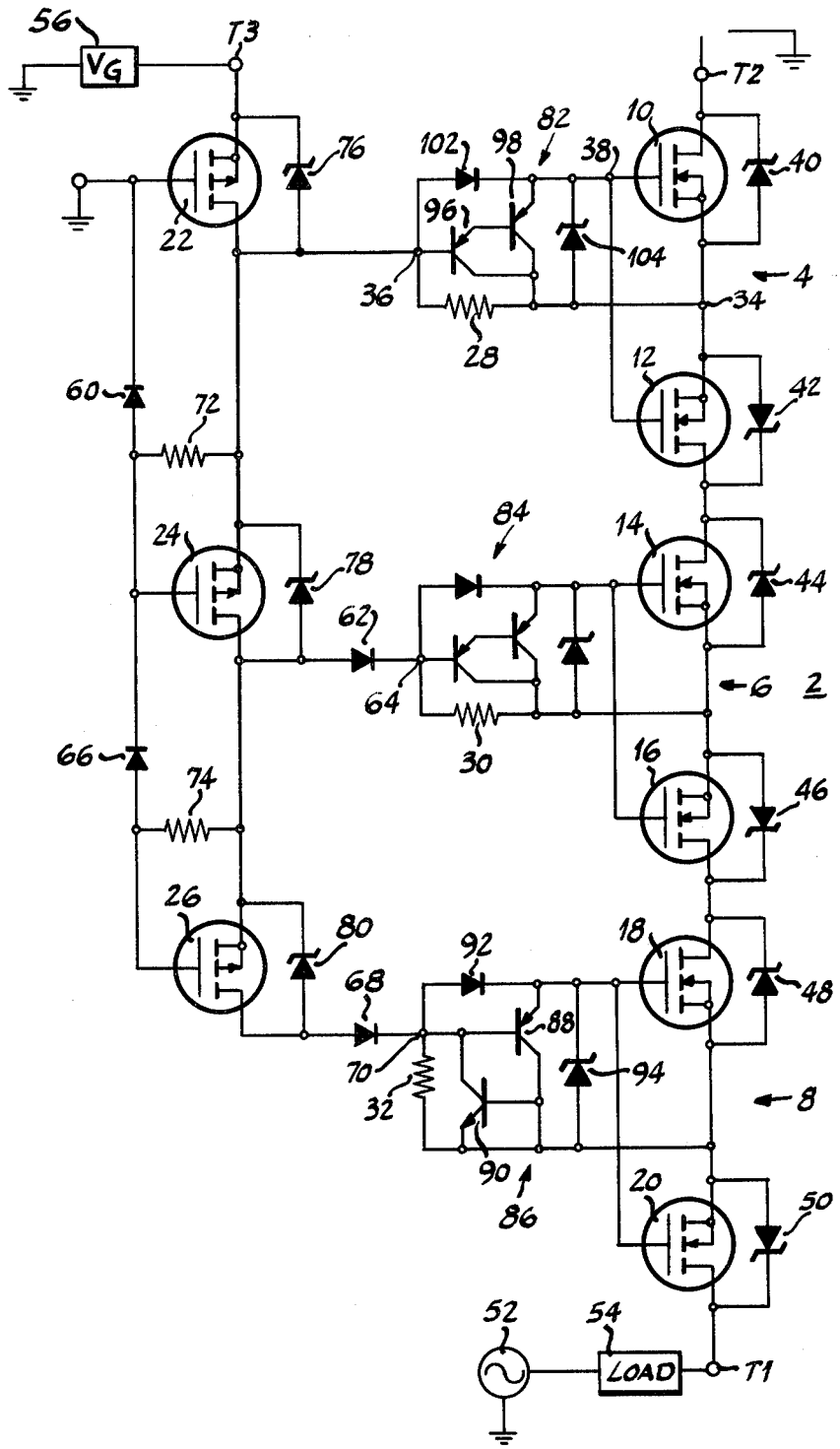

BIDIRECTIONAL SOURCE TO SOURCE STACKED FET GATING CIRCUIT

BACKGROUND AND SUMMARY

The invention relates to power FETs (field effect transistors), and more particularly to a plurality of FETs stacked in series and capable of handling bidirectional current, for AC application.

Power FETs are known in the art. A FET is unidirectional and conducts current from one main terminal to another in response to gate drive on a third terminal. This three terminal arrangement is widely accepted, and is compatible with standard circuit applications.

The stacking of power FETs in unidirectional applications is also known. Stacking is the interconnection of multiple devices in configurations that result in capabilities beyond those of a single device. The stacking of multiple power FETs in series results in higher voltage capability, and a better ratio of ON resistance to breakdown voltage. For example, connecting a pair of 100 volt devices in series results in a total voltage capability of 200 volts. The ON resistance in an individual power FET is proportional to the blocking voltage raised to the 2.6 power. Thus, doubling the blocking voltage in a single device would result in an ON resistance which is increased more than six times. Stacking of a pair of devices affords the increased voltage blocking capability but with lower ON resistance. Various problems encountered in stacking include voltage isolation, and differing gate triggering levels. Each of the gates wants to reference to a different level, but it is desirable to drive all the gates from the same source via a single gate terminal.

In order to control a load driven by an AC power source, a plural FET arrangement must be bidirectional, i.e. pass current in both directions. It is desirable that the plural FET circuit be a three terminal device which is compatible with most packaging environments.

The present invention addresses and solves the need for AC voltage capability in a series stacked plural FET arrangement. The FETs are bidirectionally stacked source to source, and have a particularly simple and effective stacked gating arrangement.

BRIEF DESCRIPTION OF THE DRAWING

The single drawing is a circuit diagram of stacked gating circuitry for bidirectionally source stacked FETs in accordance with the invention.

DETAILED DESCRIPTION

The drawing shows a three terminal bidirectional FET circuit 2 having a plurality of pairs 4, 6 and 8 of enhancement mode power FETs connected in series between first and second main terminals T1 and T2. Each pair comprises first and second FETs connected source to source in series relation, for example FETs 10 and 12 of pair 4, FETs 14 and 16 of pair 6, and FETs 18 of 20 of pair 8. My copending application Ser. No. 390,472, filed June 21, 1982, shows a pair of FETs connected source to source.

A plurality of current sources 22, 24 and 26 are connected in series, each current source connected to gates of a respective FET pair for driving the latter into conduction. A current source supplies a constant fixed level of current independent of input voltage. A plurality of resistors 28, 30 and 32 are provided, one for each power FET pair. Each resistor has one end connected to a point between the FET sources of its respective said pair, and has the other end connected to a point between its respective said current source and a point between the FET gates of its respective pair.

For example, resistor 28 has one end connected to point 34 between the sources of FETs 10 and 12, and has its other end connected to point 36 between current source 22 and point 38 between the gates of FETs 10 and 12. The gate to source potential for each FET 10 and 12 is the product of the current through resistor 28 from current source 22 and the resistance value of resistor 28. This IR drop establishes the requisite gate to source voltage to drive the corresponding FET 10 or 12 into conduction regardless of the polarity of the corresponding main terminal T1 or T2. Likewise for the remaining FET pairs, the gate to source potential for each FET of each pair is the product of the current through the respective resistor from the respective current source and the resistance value of the respective resistor, regardless of the polarity of main terminals T1 and T2.

The drawing shows each of the FETs with its reverse characteristic diode, such as 40, 42, 44, 46, 48 and 50, as is known in the art. The main terminals are shown connected across an AC power source 52, a load 54 and ground. When the voltage of terminal T1 is positive with respect to T2, FETs 20, 16 and 12 are the controlling FETs and current flows from main terminal T1 through FET 20, through diode 48, through FET 16, through diode 44, through FET 12, through diode 40 to terminal T2 when the device is in the ON state. When the voltage on terminal T1 goes negative, current flows from terminal T2 through FET 10, through diode 42, through FET 14, through diode 46, through FET 18, through diode 50 to terminal T1.

Each of current sources 22, 24 and 26 comprises a p-channel source follower grounded gate MOSFET. The source of FET 22 is connected to a gate terminal T3 which is supplied from a gating voltage source 56. The drain of FET 22 is connected to point 36. The source of FET 24 is connected to the drain of FET 22. The gate of FET 24 is grounded through diode 60. The drain of FET 24 is connected through diode 62 to point 64, which is the counterpart of point 36 of the first FET pair 4. The source of FET 26 is connected to the drain of FET 24. The gate of FET 26 is grounded through diode 66. The drain of FET 26 is connected through diode 68 to point 70, which is the counterpart of points 36 and 64. Protective resistors 72 and 74 are connected between the source and gate of respective FETs 24 and 26. Diodes 76, 78 and 80 are the reverse characteristic diodes of respective FETs 22, 24 and 26.

Each of the current sources 22, 24 and 26 may alternatively comprise a current mirror including for example a pair of PNP bipolar transistors connected base to base with commonly supplied emitters, the collector of one being connected to point 36 for example, and the collector of the other being connected to the common bases and connected through a resistor to terminal T2. This type of current mirror is known in the art. Another alternative current source is a zener regulated current source including for example a PNP bipolar transistor having its collector connected to point 36, its base connected through a zener diode to a voltage supply source, its emitter connected through a resistor to the voltage supply source, and its base also connected through a resistor to terminal T2. This type of zener regulated current source is known in the art.

Without the gating arrangement shown, the required voltage to gate FET 12 when terminal T1 is positive with respect to T2, is the gate to source voltage drop across FET 12 plus the voltage across diode 40. When the voltage on terminal T1 goes negative with respect to T2, this negative voltage is now added to the requisite turn-on gate voltage of FET 10. In order to maintain the same gate to source voltage, the requisite gate drive voltage for FET 10 now becomes the gate to source voltage drop across FET 10 plus the voltage drop across diode 42 plus the voltage on terminal T1. Current source 22 eliminates the effects of this latter T1 terminal voltage on the gate voltage. Using current source 22, the resulting gate to source voltage of both FETs 12 and 10 will be the IR drop through resistor 28 which is fixed by the constant current. Referenced resistor 28 sets the voltage between points 38 and 34 to thus provide the same gate to source voltage for FETs 12 and 10 regardless of the voltage on terminal T1.

In operation, FET pairs 4, 6 and 8 turn on sequentially in a ripple effect. With terminal T1 positive with respect to terminal T2, FET 12 turns on first, which conduction lowers the potential on the source of FET 16 through diode 44, to establish the requisite gate to source voltage to turn on FET 16. Conduction of FET 16 lowers the potential on the source of FET 20 through diode 48, which establishes the requisite gate to source voltage drop to turn on FET 20. The ripple ON effect in the reverse direction is comparable.

A plurality of fast gate turn-off circuits 82, 84 and 86, one for each FET pair, are provided for depleting residual charge from the power FET gates, for fast turn-off. Circuitry 86 is like that shown in my copending application Ser. No. 390,482, filed June 21, 1982, and facilitates fast turn-off by rapidly draining the stored energy in the gate to source capacitance of FETs 18 and 20. Fast turn-off circuitry 86 includes bipolar PNP transistor 88 whose emitter to base junction is forward biased at turn-off of FET 18 or 20 due to the residual positive charge on the gates of the latter. Thus, when gate drive is removed from gate terminal T3, the base of transistor 88 goes low with respect to the emitter of transistor 88, whereby the latter goes into conduction. Current flowing through transistor 88 supplies base drive for an NPN bipolar transistor 90, driving the latter into conduction. Conduction of transistor 90 draws base current from transistor 88 whereby to latch transistors 88 and 90 into conduction in a regenerative loop. Conduction of transistors 88 and 90 thus discharges the gates of FETs 18 and 20 to thus facilitate faster turnoff thereof. Blocking diode 92 insures turn-on of transistors 88 and 90. Zener diode 94 provides overvoltage protection for the gates of FETs 18 and 20.

An alternative fast turn-off circuit 82 is shown for the first transistor pair 4. Upon removal of gating voltage from terminal T3, the base of PNP bipolar transistor 96 goes low with respect to its emitter which is connected to the base of another PNP bipolar transistor 98 in Darlington relation, such that transistors 96 and 98 are rendered conductive due to the relative positive charge on the emitter of transistor 98 which is connected to the gates of FETs 10 and 12 at point 38. Blocking diode 102 provides the requisite voltage drop between the emitter of transistor 98 and base of transistor 96, and resistor 28 provides the requisite return path, to enable turn-on of Darlington transistor pair 96 and 98, to thus quickly discharge the residual positive stored charge in the source to gate capacitances of FETs 10 and 12. Zener diode 104 provides overvoltage protection for the gates of FETs 10 and 12.

In other embodiments, the fast turn-off circuitry 82, 84 and/or 86 may be like that shown in my copending application Ser. Nos. 390,720 or 390,481, filed June 21, 1982. In the former, a fast turn-off circuit is provided by a JFET in the gate circuit of the power FET which is connected to the same gate drive terminal as the power FET. The JFET becomes conductive upon turn-off of the power FET due to removal of gate drive. Conduction of the JFET provides faster discharge therethrough of residual stored charge on the power FET gate, whereby to facilitate faster turn-off. A zener diode is connected in the gating circuitry and has a greater breakover voltage than the pinch-off voltage of the JFET, such that during turn-on, gate drive first pinches off the JFET and then charges up the power FET gate to drive the power FET into conduction. In the latter, nonregenerative bipolar transistor means is provided in the gate circuit of the FET to facilitate fast turn-off without reverse gating current and its attendant auxiliary power supply.

It is recognized that various modifications are possible within the scope of the appended claims.

I claim:

1. A bidirectional FET circuit comprising:
a plurality of pairs of enhancement mode power FETs, each pair comprising first and second FETs connected source to source in series relation, said pairs connected in series between first and second main power terminals, current conduction in one direction flowing through the series connection of the drain-source current path of said first FET and the forward biased substrate-drain PN junction of said second FET, and in the opposite direction through the series connection of the drain-source current path of said second FET and the forward biased substrate-drain PN junction of said first FET; and
a plurality of gating circuits, one gating circuit for each said pair of power FETs for driving the latter into conduction, wherein said gating circuits are stacked in series for driving said pairs of power FETs sequentially into conduction from a single gate terminal.

2. A bidirectional FET circuit comprising:
a plurality of pairs of enhancement mode power FETs, each pair comprising first and second FETs connected source to source in series relation, said pairs connected in series between first and second main power terminals, current conduction in one direction flowing through the series connection of the drain-source current path of said first FET and the forward biased substrate-drain PN junction of said second FET, and in the opposite direction through the series connection of the drain-source current path of said second FET and the forward biased substrate-drain PN junction of said first FET; and
a plurality of current sources connected in series, each current source connected to the gates of a respective said FET pair for driving the latter into conduction.

3. The invention according to claim 2 comprising a plurality of resistors one for each said power FET pair, each said resistor having one end connected to a node connecting the FET sources of its respective said pair, and having the other end connected to a node connecting its respective said current source and a node connecting the FET gates of its respective pair, such that the gate of source potential for each FET of each pair is the product of the current through the respective said resistor from the respective said current source and the resistance value of the respective said resistor, regardless of the polarity of the said main power terminals.

4. The invention according to claim 3 wherein said current sources are connected in series between a single gate terminal and the gates of the final said power FET pair.

5. The invention according to claim 4 wherein said current sources comprise a plurality of source followers FETs.

6. The invention according to claim 5 wherein:
said main power terminals are connectable across an AC power source, a load and ground;
said gate terminal is connectable to a source of gate voltage referenced to ground; and
said current source FETs comprise p-channel MOSFETs, each having a gate connected to ground, each having a drain connected to the source of the next successive current source FET and also connected to the gates of its respective said power FET pair, the source of the first said current source FET being connected to said gate terminal.

7. The invention according to claim 3 comprising a plurality of fast turn-off circuits, one for each said power FET pair, each fast turn-off circuit comprising transistor means biased into conduction by removal of gate drive and by residual stored charge in the gate to source capacitance of said FETs of its respective pair, said transistor means in a conductive state depleting said residual charge from said FET gates of its respective said pair.

8. The invention according to claim 7 wherein at least one said transistor means comprises a pair of regeneratively coupled bipolar transistors driven into latched conduction by the residual stored charge on said FET gates of its respective said pair in combination with the absence of gate current.

9. The invention according to claim 8 wherein said bipolar transistors comprise a first PNP transistor having its emitter connected to a node connecting said FET gates of its respective said pair and having its base connected to said respective current source, and an NPN transistor having its base connected to the collector of said PNP transistor, its collector connected to the base of said PNP transistor, and its emitter connected to said node connecting said FET sources of its respective said pair.

10. The invention according to claim 7 wherein said transistor means of said fast turn-off circuit comprises a pair of bipolar transistors connected in Darlinton relation between said node connecting said FET gates of its respective said pair and said node connecting said FET sources of its respective said pair, and having a base connected to said respective current source.

11. The invention according to claim 10 wherein said Darlington transistor pair comprises a first PNP transistor having its emitter connected to said node connecting said FET gates of its respective said pair and its collector connected to said node connecting said FET sources of its respective said pair, and a second PNP transistor having its emitter connected to the base of said first PNP transistor, its base connected to said respective current source, and its collector connected to said node connecting said FET sources of its respective said pair.

12. A three terminal bidirectional FET circuit comprising:
a plurality of pairs of enhancement mode power FETs, each pair comprising first and second FETs connected source to source in series relation, said pair connected in series between first and second main power terminals, current conduction in one direction flowing through the series connection of the drain-source current path of said first FET and the forward biased substrate-drain PN junction of said second FET, and in the opposite direction through the series connection of the drain-source current path of said second FET and the forward biased substrate-drain PN junction of said first FET;
a plurality of gating FETs connected in series for successive turn-on, each said gating FET also connected to a respective one of said pairs of power FETs for like successive turn-on of the latter.

13. The invention according to claim 12 wherein each said gating FET is connected to each of the gates of said power FETs of its respective said pair and also connected through resistance means to a node connecting the sources of said power FETs of its respective said pair to establish the gate to source voltage of the latter for turn-on regardless of the polarity of said main power terminals.

14. The invention according to claim 12 wherein said gating FETs are connected in common gate configuration with their gates connected to a common reference voltage.

* * * * *